(12) United States Patent
Torres et al.

(10) Patent No.: US 10,359,468 B2
(45) Date of Patent: Jul. 23, 2019

(54) THERMAL LASER STIMULATION APPARATUS, METHOD OF THERMALLY STIMULATING, AND NON-TRANSITORY COMPUTER READABLE MEDIUM

(71) Applicant: TOSHIBA MEMORY CORPORATION, Minato-ku (JP)

(72) Inventors: Juan Felipe Torres, Kawasaki (JP); Hiroya Kano, Ota (JP); Masataka Shiratsuchi, Kawasaki (JP); Shinichi Tatsuta, Taito (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 299 days.

(21) Appl. No.: 15/389,917

(22) Filed: Dec. 23, 2016

(65) Prior Publication Data

US 2017/0269154 A1 Sep. 21, 2017

(30) Foreign Application Priority Data

Mar. 16, 2016 (JP) ................................. 2016-053114

(51) Int. Cl.
| | | |
|---|---|---|
| *H01S 3/00* | (2006.01) | |
| *G01R 31/28* | (2006.01) | |
| *G01R 31/311* | (2006.01) | |

(52) U.S. Cl.
CPC ........ *G01R 31/311* (2013.01); *G01R 31/2874* (2013.01); *H01S 3/0014* (2013.01); *H01S 3/0071* (2013.01); *G01R 31/2875* (2013.01)

(58) Field of Classification Search
CPC . G01R 31/311; G01R 31/2874; H01S 3/0071; H01S 3/0014

USPC ................................. 324/750.12; 219/121.68
See application file for complete search history.

(56) References Cited

U.S. PATENT DOCUMENTS

| | | | | |
|---|---|---|---|---|
| 5,103,073 | A * | 4/1992 | Danilov | ............. B23K 26/0604 219/121.68 |
| 6,320,396 | B1 | 11/2001 | Nikawa | |
| 2007/0096763 | A1* | 5/2007 | Ehrmann | ........... G01R 31/2891 324/750.23 |
| 2007/0115003 | A1* | 5/2007 | Nikawa | ................ G01R 31/311 324/501 |

(Continued)

FOREIGN PATENT DOCUMENTS

| | | |
|---|---|---|
| JP | 9-260286 | 10/1997 |
| JP | 10-50784 | 2/1998 |
| JP | 2005-45144 | 2/2005 |

(Continued)

*Primary Examiner* — Farhana A Hoque
(74) *Attorney, Agent, or Firm* — Oblon, McClelland, Maier & Neustadt, L.L.P.

(57) ABSTRACT

An apparatus according to an embodiment comprises: a laser source that outputs a laser beam; an optical system that modifies the laser beam, and directs the modified laser beam onto a test object; a signal detector that detects a change of signal in the process of irradiating the test object with the modified laser beam; and a computer system that performs a failure analysis based on the change detected by the signal detector, wherein the optical system modifies the laser beam so that the modified laser beam generates an irradiation zone that includes a first intensity component of which peak intensity is near an irradiation axis and a second intensity component of which peak intensity is around the irradiation axis.

17 Claims, 17 Drawing Sheets

(56) References Cited

U.S. PATENT DOCUMENTS

2017/0074928 A1  3/2017  Torres et al.

FOREIGN PATENT DOCUMENTS

| JP | 2005-300250 | 10/2005 |
| JP | 2007-127499 | 5/2007 |
| JP | 2010-197051 | 9/2010 |
| JP | 2012-138456 | 7/2012 |
| JP | 2012-222263 | 11/2012 |
| JP | 2013-36953 | 2/2013 |
| JP | 2013-104667 | 5/2013 |
| JP | 2014-107483 | 6/2014 |
| JP | 2014-143348 | 8/2014 |
| JP | 2014-175421 | 9/2014 |
| JP | 2015-32686 | 2/2015 |
| JP | 2017-58225 A | 3/2017 |

* cited by examiner

| PROFILE | GAUSSIAN COMPONENT, $P_G$ [u] | DOUGHNUT COMPONENT, $P_D$ [u] |
|---|---|---|
| GAUSSIAN (G2) | 100 | 0 |
| CASE A (M2) | 15 | 85 |
| CASE B (M3) | 10 | 90 |
| DOUGHNUT (D2) | 0 | 100 |

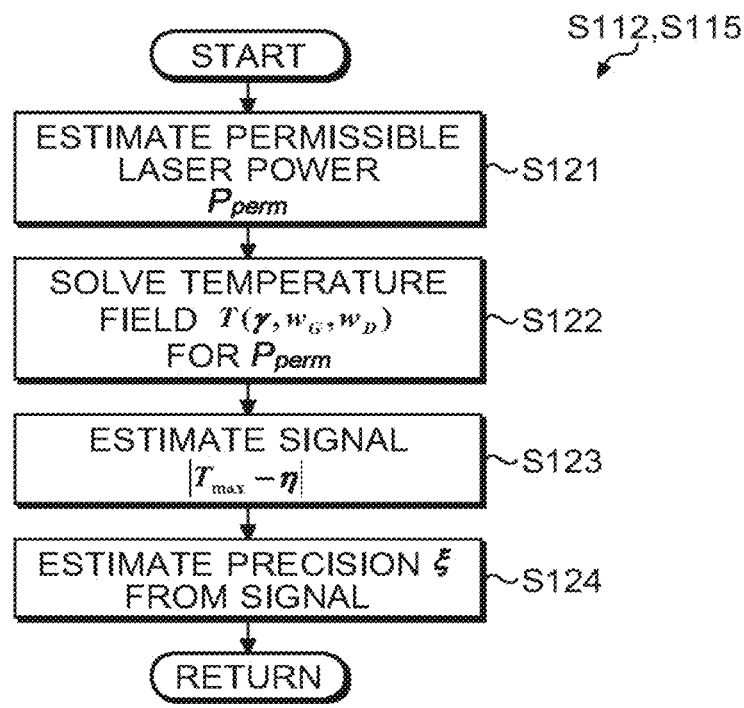

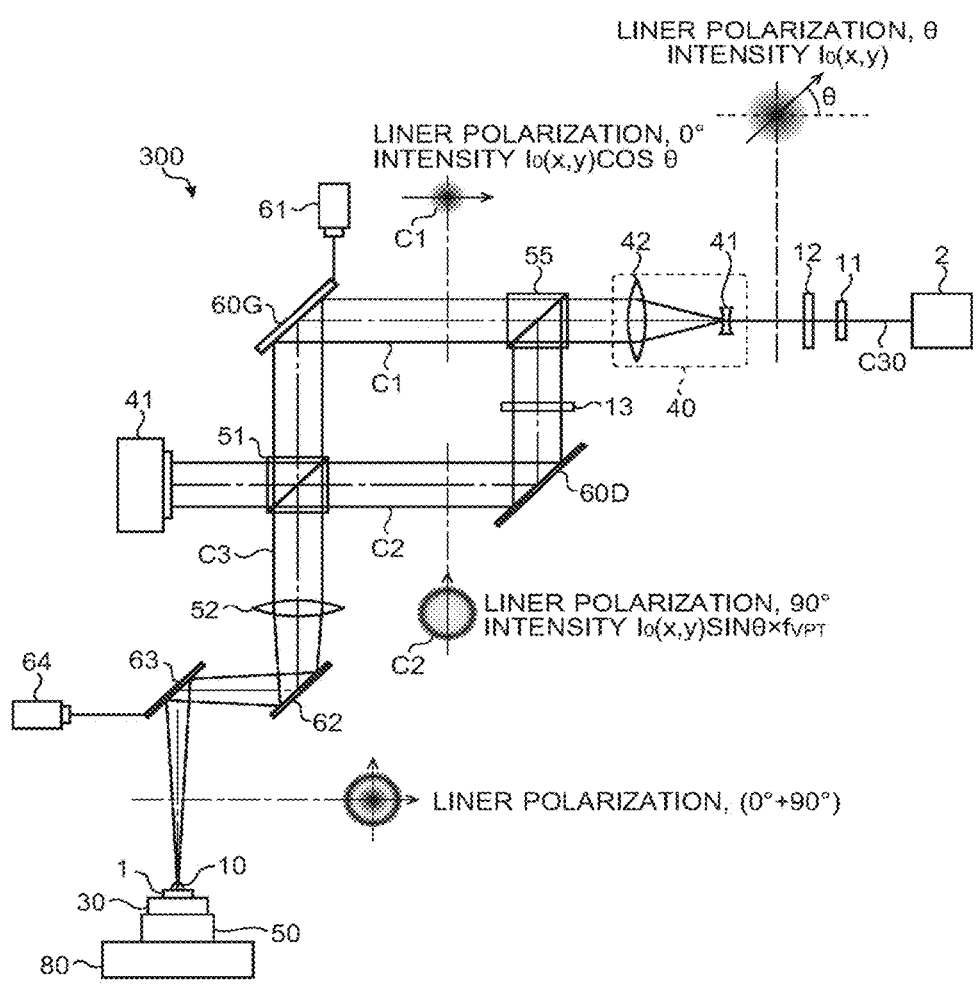

THERMAL LASER STIMULATION APPARATUS, METHOD OF THERMALLY STIMULATING, AND NON-TRANSITORY COMPUTER READABLE MEDIUM

CROSS-REFERENCE TO RELATED APPLICATIONS

This application is based upon and claims the benefit of priority from Japanese Patent Application No. 2016-053114, filed on Mar. 16, 2016; the entire contents of which are incorporated herein by reference.

FIELD

The present disclosure relates to a thermal laser stimulation apparatus, a method of thermally stimulating, and a non-transitory computer readable medium.

BACKGROUND

The need in the semiconductor industry for a higher performance in very-large-scale integration (VLSI) has pushed the boundaries of photolithography. Photolithography increases both the resolution and throughput of a microfabrication pattern by using ultraviolet light, i.e., short wavelength light, which has successfully yielded features sizes as small as 50 nm. In spite of this significant downsizing, the resolution of photolithography appears to have reached its limit, paving the way for new emerging technologies. Semiconductor stacked packing stands out as the most promising emerging technology representing a significant paradigm shift in VLSI manufacturing. Instead of further downsizing photolithography, semiconductor stacked packing makes use of multilayer stacking for increasing the transistor density in a VLSI chip.

Moreover, in semiconductor manufacturing, failure detection is an essential process that guarantees the reliability of the product while improving its yield. Historically, failure detection techniques have been developed parallel to the advancements in semiconductor manufacturing. For example, techniques such as Lock-in Thermography (LIT), Transmission Electron Microscope (TEM), Laser Voltage Imaging (LVI) and Optical Beam Induced Resistance Change (OBIRCH) have become well-stablished failure analysis techniques in the semiconductor industry.

BRIEF DESCRIPTION OF THE DRAWINGS

FIG. 6C is a flowchart for explaining steps S112 and S115 in FIG. 6B in more detail;

FIG. 11 is a schematic diagram showing another example of the optical system according to the embodiment.

DETAILED DESCRIPTION

Figure 1:
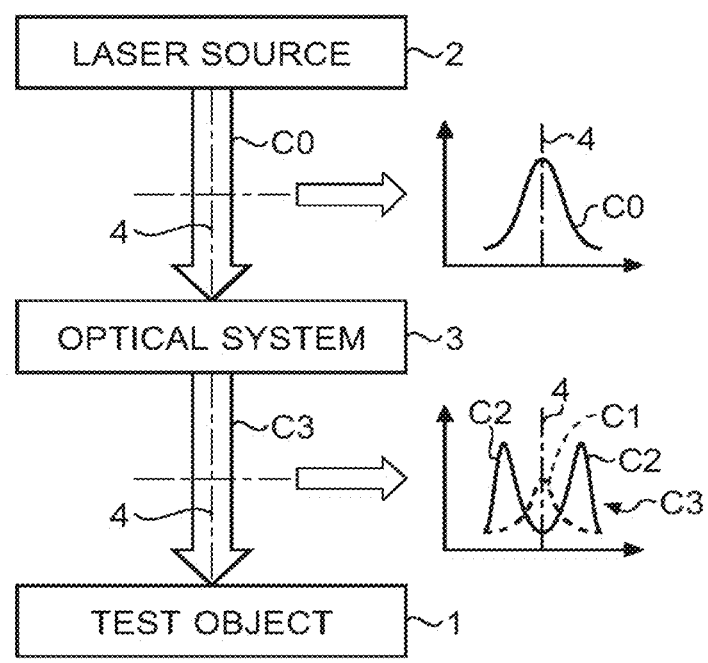
FIG. 1 is a diagram illustrating a concept of an embodiment.

The presently disclosed subject matter will be described more fully hereinafter with reference to the accompanying Drawings wherein like numbers refer to like elements throughout. Not all embodiments of the inventions are shown; the presently disclosed subject matter may be embodied in many different forms and should not be construed as limited to the embodiments set forth herein. Indeed, many modifications and other embodiments of the presently disclosed subject matter set forth herein will come to mind to one skilled in the art related to the presently disclosed subject matter. The detailed embodiments disclosed hereinafter serve as examples of possible setups to perform an effective thermal stimulation of a test object.

In the following embodiments, an apparatus, method and program for thermal laser stimulation and detection of faults embedded in a test object will be presented. A common test object could be, but is not limited to, a multilayer semiconductor or semiconductor device with inner circuit patterns. The following embodiments significantly advance conventional Optical Beam Induced Resistance Change (OBIRCH) by using a disclosed method to control a heat source, such as a doughnut-shaped heat source, in order to achieve a more efficient thermal stimulation of a test object.

Each of the embodiments relates to the method for performing an efficient thermal laser stimulation of faults embedded in a test objects that can be, but are not limited to, a multilayer semiconductor or a very-large-scale integration (VLSI) device. The efficient thermal stimulation achieved with one of the disclosed embodiments allows a subsequent detection, analysis, and/or identification of faults embedded in the test object by, for example, measuring a change of any thermophysical properties (e.g., electrical resistivity) or related physical value (e.g., electrical resistance) in a part or a plurality of circuits inside the test object.

In order to detect faults in a test object, numerous failure analysis techniques have been developed. However, most well-stablished failure analysis techniques can only be applied to planar (one layer) devices because their measurement principle is not suitable, or it is poorly suited, for multilayer devices. For example, Laser Voltage Imaging (LVI) shows the physical locations of transistors that are active at specific frequency by directing a laser beam onto a semiconductor an analyzing the reflected laser light. In the case of a multilayer semiconductor, however, the light is absolved in the shallow layers and faults that are located in deep layers cannot be detected with LVI. In contrast, Optical Beam Induced Resistance Change (OBIRCH) is a promising technique for detecting faults that are even deeply embedded in a VLSI device because heat diffusion could effectively stimulate these faults that are not directly stimulated by an external irradiation.

Nevertheless, two problems arise when applying conventional OBIRCH to a complex test object such as a multilayer semiconductor. First, it becomes more difficult to produce significant thermally-induced changes of thermophysical properties in deep layers since the thermal stimulation is reduced as the depth of the fault increases. Second, a laser power increase, i.e., larger heat generation rate, would improve the chances of successfully stimulating a deep fault, but at the same time a laser power increase could damages the device due to high temperature that could even surpass the melting point of a material inside a test object.

In the following embodiments, a thermal laser stimulation apparatus, a method of thermally stimulating, and a program, which can sufficiently stimulate faults deeply embedded in a test object, such as VLSI, while decreasing the temperature inside the test object in order to keeping it below a permissible temperature, will be explained. According to the embodiments, it becomes possible to perform a nondestructive failure analysis of a test object with deeply embedded faults.

FIG. 1 illustrates a concept of a thermal laser stimulation according to an embodiment. As shown in FIG. 1, in the thermal laser stimulation according to the embodiment, an optical system 3 is used for modifying a laser beam C0 outputted from a laser source 2, which may have a Gaussian intensity profile, into a modified laser beam C3 whose wavefront is characteristic of generating two or more intensity components: one intensity component C1 that increases the intensity near the irradiation axis 4; and another intensity component C2 that increases the intensity around the irradiation axis 4.

The intensity component C1 may have a Gaussian intensity profile of which peak intensity is weaker than that of the laser beam C0, and the intensity component C2 may have a doughnut-shape intensity profile of which peak intensity is around the intensity component C1. By using such laser beam C3 for thermally-stimulating a test object 1, it is possible to reduce a peak temperature (or maximum temperature, $T_{max}$) in shallow layers of the test object 1 while thermally stimulating deep layers of the test object 1. This reduction of peak temperature allows an increase of laser power that further enhances the thermal stimulation for faults deeply embedded in the test object 1 and, as a consequence, improves the measurement precision for these faults.

Figure 2:
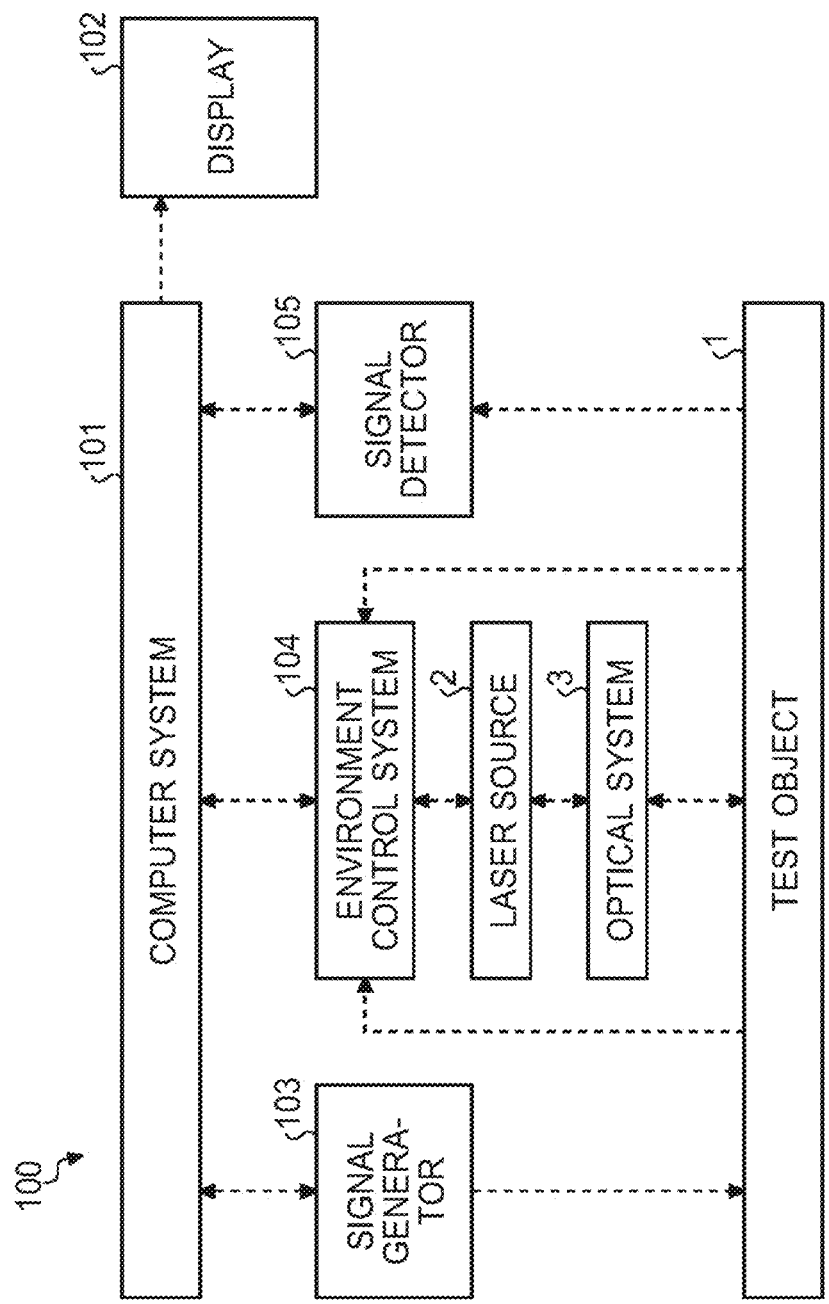
FIG. 2 is a diagram illustrating a configuration of a thermal laser stimulation apparatus according to the embodiment.

FIG. 2 is a diagram illustrating a configuration of a thermal laser stimulation apparatus according to the embodiment. As shown in FIG. 2, the thermal laser stimulation apparatus 100 comprises a computer system 101, a display 102, a signal generator 103, an environment control system 104, a signal detector 105, a laser source 2, and an optical system 3.

The laser source 2 outputs a laser beam C0. The optical system 3 modifies the intensity pattern of the laser beam C0 according to the following method, and directs the modified laser beam C3 with the two intensity components C1 and C2 onto a test object 1. The optical system 3 also scans the laser beam C3 on one or more surfaces of the test object 1.

The environment control system 104 controls the ambient temperature, humidity, and pressure inside the thermal laser stimulation apparatus 100. The environment control system 104 also control the initial temperature and boundary temperature of a test object 1.

The computer system 101 controls the thermal laser apparatus 100, determines a set of thermal laser stimulation conditions, and performs a failure analysis from the output signal of the signal detector 105.

The signal generator 103 generates a signal inside one or more preselected circuits in a test object 1. The signal detector 105 measures the generated (unstimulated) signal and/or stimulated signal in one or more preconditioned circuits as the heat source is scanned on the test object 1. The signal detector 105 also outputs the measured data to the computer system 101.

The display 102 outputs the conditions and results of the failure analysis performed by the computer system 101.

The modified laser beam C3 can consist on any pattern characteristic of having the intensity component (hereinafter referred to as central component) C1 near the irradiation axis 4 and the intensity component (hereinafter referred to as peripheral component) C2 surrounding the central component C1. Central axes of the two intensity components C1 and C2 have the same location as the irradiation axis 4 or in its proximity.

Figure 3A:
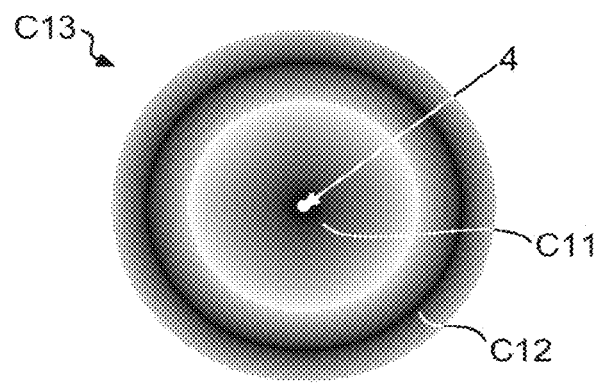
FIG. 3A is an illustration showing a modified laser beam according to a first example of the embodiment.
Figure 3B:
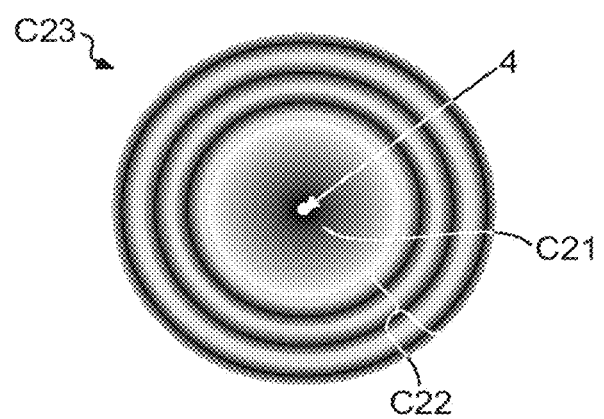
FIG. 3B is an illustration showing another modified laser beam according to a second example of the embodiment.
Figure 3C:
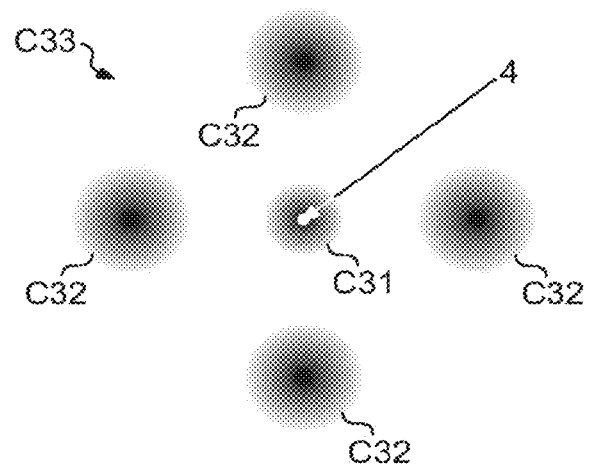
FIG. 3C is an illustration showing yet another modified laser beam according to a third example of the embodiment.

FIGS. 3A to 3C are illustrations of possible modified laser beams C3.

FIG. 3A shows a modified laser beam C13 according to a first example. This simple modified laser beam C13 comprises a spot-like component C11 and a ring-like component C12. The spot-like component C11 corresponds to the central component C1, and the ring-like component C12 corresponds to the peripheral component C2. The spot-like component C11 is surrounded by the ring-like component C12. According to such first example, the spot-like component C11 and the ring-like component C12 are considered as a Gaussian intensity profile and a doughnut-shaped intensity profile, respectively.

However, the concept of modified laser beam C3 described above can have a plurality of forms and it is not restrictive to a Gaussian and/or a doughnut-shaped intensity. For example, FIG. 3B shows another modified laser beam C23 according to a second example. The modified laser beam C23 comprises a spot-like component C21 corresponding to the central component C1 and multiple concentric ring components C22 corresponding to the peripheral component C2. The spot-like component C21 is surrounded by the multiple concentric ring components C22. These multiple concentric ring components C22 could be formed by superimposing multiple doughnut-shaped intensities. Likewise, the modified laser beam C23 could be formed by focusing a laser beam near its theoretical limit where a Gaussian-like profile is surrounded by multiple local maximums, such as in an Airy disk.

Moreover, the peripheral component C2 is not necessarily axisymmetric. For example, FIG. 3C shows yet another modified laser beam C33 according to a third example. The modified laser beam C33 comprises a central Gaussian component C31 corresponding to the central component C1 and peripheral Gaussian components C32 corresponding to the peripheral component C2. The central Gaussian component C31 is surrounded by the peripheral Gaussian components C32 whose centroid (or weighted arithmetic mean) coincides with that of the central Gaussian component C31. In FIG. 3C, four Gaussian components C32 form the peripheral component C2; however the peripheral component C2 could be formed by two or more Gaussian components C32.

Characteristics of the modified laser beam C3 can be controlled using the following irradiation parameters, for instance. The irradiation parameters may include: a laser power $P_G$ of Gaussian distribution (C1), a laser power $P_D$ of a doughnut-shaped distribution (C2), a characteristic radius $w_G$ of the Gaussian distribution (C1), and a characteristic radius $w_D$ of the doughnut-shaped distribution (C2).

The irradiation parameters are introduced into Equation (1). According to the embodiment, an irradiation of the test object 1 with the modified laser beam C3 generates a three-dimensional heat generation profile S in the test object 1 as described by Equation (1). This heat generation profile could also be a numerical result of an optical calculation or an approximation function alternative to Equation (1).

$$S = \frac{\alpha}{\pi}\left[\frac{2P_G}{w_G^2}\exp\left(-2\frac{x^2+z^2}{w_G^2}\right) + \frac{P_D}{w_D^2}\left(\frac{x^2+z^2}{w_D^2}\right)\exp\left(\frac{x^2+z^2}{w_D^2}\right)\right]\exp(-\alpha|y|) \quad (1)$$

In Equation (1), x, y and z are Cartesian coordinates (−y is a direction of a depth; x and z are on a two-dimensional plane of a chip) and α is the attenuation coefficient defined in Equation (2).

$$\alpha = \frac{4\pi\kappa}{\lambda_0} \quad (2)$$

In Equation (2), κ is an extinction coefficient and $\lambda_0$ is a wavelength. Note that Equation (1) has two characteristics. First, an incident laser beam (i.e., the modified laser beam C3) is exponentially absorbed along the depth in the test object 1 so that the exponential depression characterized by the attenuation coefficient is in Equation (1). Second, the irradiation axis is located at (x,z)=(0,0).

The irradiation of the test object 1 with the modified laser beam C3 that generates the three-dimensional heat generation profile S according to Equation (1) would reduce the maximum temperature inside the test object 1 in comparison to a single (conventional) Gaussian irradiation.

Figure 4:
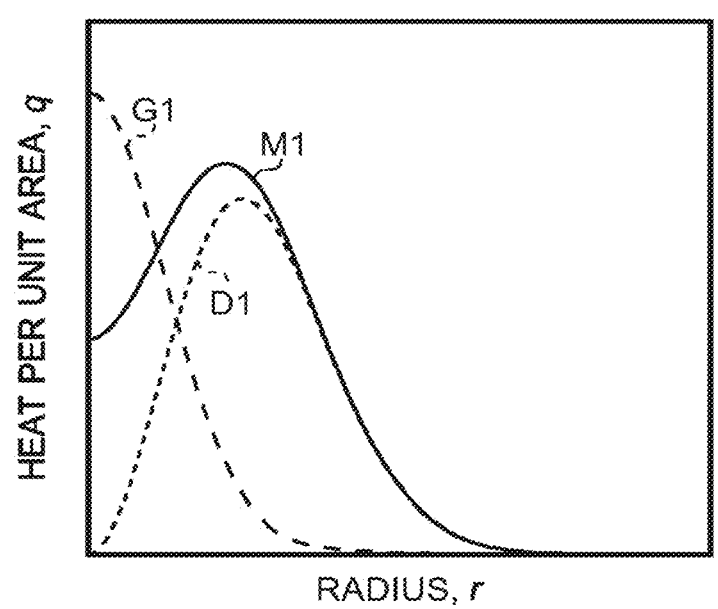
FIG. 4 is a diagram for explaining an example of a determination of heat source according to the embodiment.

FIG. 4 shows heat generation profiles in cases that the test object 1 is irradiated with a laser beam with a Gaussian intensity profile (hereinafter referred to as a Gaussian laser beam), a laser beam with a doughnut-shape intensity profile (hereinafter referred to as a doughnut-shape laser beam), and the modified laser beam according to the embodiment, respectively. Abscissa and ordinate axes in FIG. 4 are radius r (here, $r^2=x^2+z^2$) and heat generated by unit of area q (dimensionless value), respectively. Moreover, the characteristic radius of the Gaussian intensity profile we and the characteristic radius of the doughnut-shaped intensity profile $w_D$ are $w_G=w_D=0.5$, while the intensity of the Gaussian intensity profile $P_G$ is 10 [u] and the intensity of the doughnut-shaped intensity profile $P_D$ is 90 [u], where "u" are units of power. Note that, except for the power, these physical quantities presented have been normalized (dimensionless values). A consistent normalization is performed so that physically meaningful results are presented.

In FIG. 4, a line G1 shows a heat generation profile in a first case where the test object 1 is irradiated with the Gaussian laser beam, a line D1 shows a heat generation profile in a second case where the test object 1 is irradiated with the doughnut-shape laser beam, and a line M1 shows a heat generation profile in a third case where the test object 1 is irradiated with the modified laser beam C3.

As suggested in FIG. 4, whereas generated heat concentrates on an irradiation axis (here, r=0) in the first case and generated heat concentrates on a peripheral area of an irradiation axis in the second case, in the third case, generated heat is distributed from an irradiation axis to its peripheral area thereof. This indicates that the modified laser beam C3 can sufficiently stimulate faults deeply embedded in the test object 1 while decreasing the temperature inside the test object 1 in order to keeping it below a permissible (or allowable) temperature.

Figures 5A, 5B:
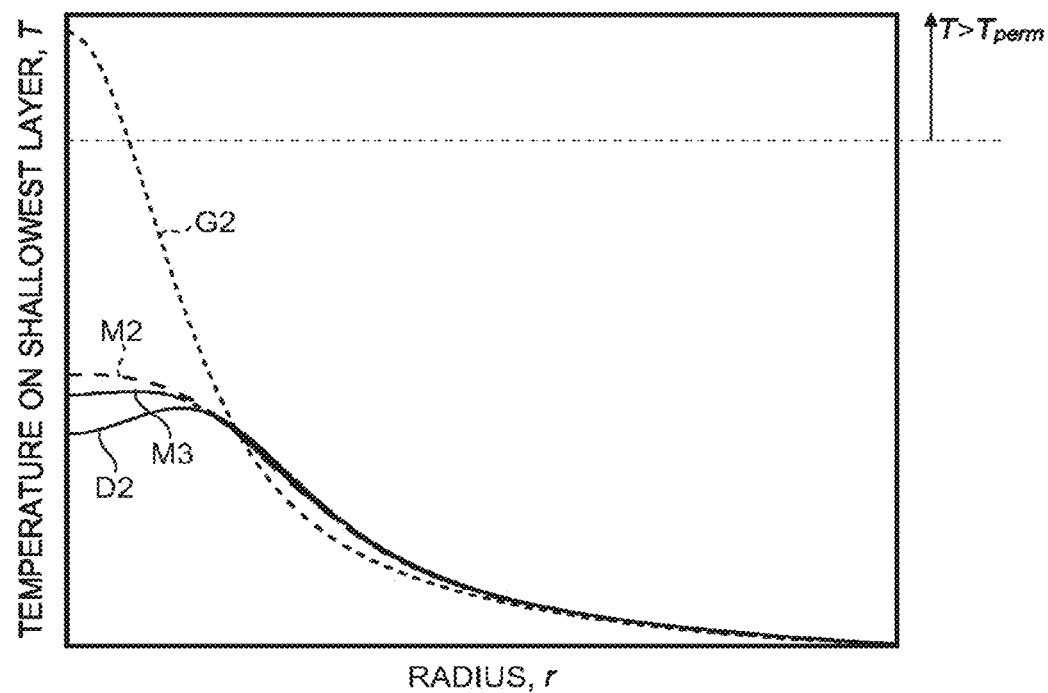
FIG. 5A is a table showing examples of irradiation laser beams according to the embodiment.
FIG. 5B is a graph showing numerical results of temperature distributions on a shallowest (hottest) layer in a test object according to the embodiment.

FIG. 5A shows variations of irradiation laser beams and FIG. 5B shows numerical results of temperature distributions on a shallowest (hottest) layer in the test object 1, i.e., y=0, for each variation shown in FIG. 5A. As shown in FIG. 5A, in this explanation, four variations are exemplified. A first variation (GAUSSIAN) is a Gaussian laser beam of which a Gaussian component $P_G$ is 100 [u] and a doughnut component $P_D$ is 0 [u]. A second variation (CASE A) is a modified laser beam (one variation of the modified laser beam C3) of which the Gaussian component $P_G$ is 15 [u] and the doughnut component $P_D$ is 85 [u]. A third variation (CASE B) is a modified laser beam (another variation of the modified laser beam C3) of which the Gaussian component $P_G$ is 10 [u] and the doughnut component $P_D$ is 90 [u]. A fourth variation (DOUGHNUT) is a doughnut-shape laser beam of which a Gaussian component $P_G$ is 0 [u] and a doughnut component $P_D$ is 100 [u].

A maximum temperature in the test object 1 for each variation can be expected on the shallowest (hottest) layer in the test object 1, i.e., y=0. In FIG. 5B, the temperature is normalized with a permissible temperature, i.e., T=T*/$T_{perm}$, where T* is the dimensional temperature and $T_{perm}$ is a permissible temperature in the test object 1. The numerical calculations for the variations (GAUSSIAN, CASE A, CASE B, and DOUGHNUT) were conducted with a net power of 100 [u], i.e., $P_G+P_D=100$ [u]

In FIG. 5B, a line G2 shows a maximum temperature when the test object 1 is irradiated with the first variation laser beam, a line M2 shows a maximum temperature when the test object 1 is irradiated with the second variation laser beam, a line M3 shows a maximum temperature when the test object 1 is irradiated with the third variation laser beam, and a line D2 shows a maximum temperature when the test object 1 is irradiated with the fourth variation laser beam.

FIG. 5B shows advantageous effects where the maximum temperatures on the surface of the test object 1 are considerably reduced for the second to fourth variation laser beams in comparison to the first variation laser beam. Moreover, for this net power, the maximum temperature for the first variation laser beam surpasses the permissible temperature ($T>T_{perm}$). In contrast, for the second to fourth variation laser beams, i.e., for the irradiation laser beam including the doughnut component, the maximum temperature is below the permissible temperature ($T \leq T_{perm}$); hence, a cooler surface is reached when a doughnut component is applied. As stated above, a decrease of maximum temperature allows a further increase of the laser power, which leads to an enhanced thermal laser stimulation that improves the accuracy in a failure analysis test.

Figure 6A:
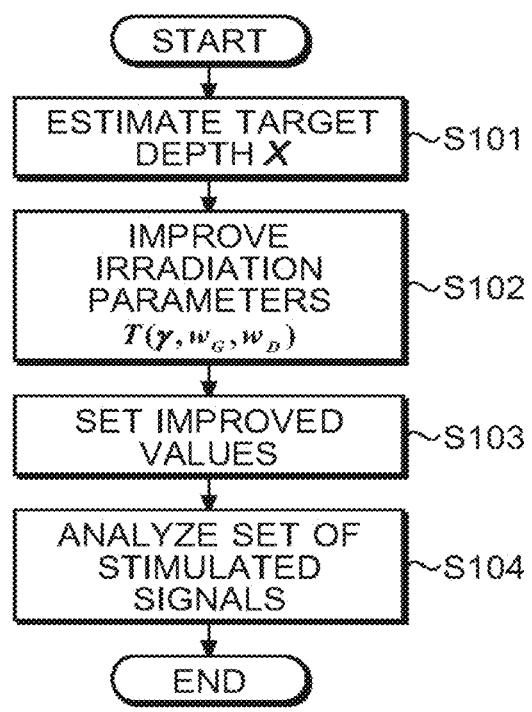
FIG. 6A is a flowchart illustrating a main process of a thermal laser stimulation method performed by the thermal laser stimulation apparatus according to the embodiment.

FIGS. 6A to 6D are flowcharts of a thermal laser stimulation method according to the embodiment. FIG. 6A shows a flowchart illustrating a main process of the thermal laser stimulation method performed by the thermal laser stimulation apparatus according to the embodiment.

As shown in FIG. 6A, in step S101, the computer system 101 estimates a depth X of a fault by an electrical method before thermally stimulating the test object 1. For example, a constant voltage can be applied to each of the layers with the signal generator 103 and, when one fault or multiple faults are located on a given layer, then the current measured with the signal detector 105 would significantly differ from those layers that lack faults, i.e., for a faulty layer there is an anomaly in the current measurement. Likewise, by applying a constant current with the signal generator 103, the signal detector 105 can detect anomalies of the voltage. From the detected anomaly the depth of the fault X (target depth) can be estimated based on a layer number and a blueprint of the structure of the test object 1, e.g., providing information on layer thickness. In step S102, the computer system 101 improves the irradiation parameters T ($\gamma$, $w_G$, $w_D$) in order to enhance the thermal stimulation of a fault. In step S103, the computer system 101 sets the improved parameters in the laser source 2, the optical system 3 and the environment control system 104 of the thermal stimulation apparatus 100. In step S104, the computer system 101 analyzes a set of stimulated signals detected by the signal detector 105.

Figure 6B:
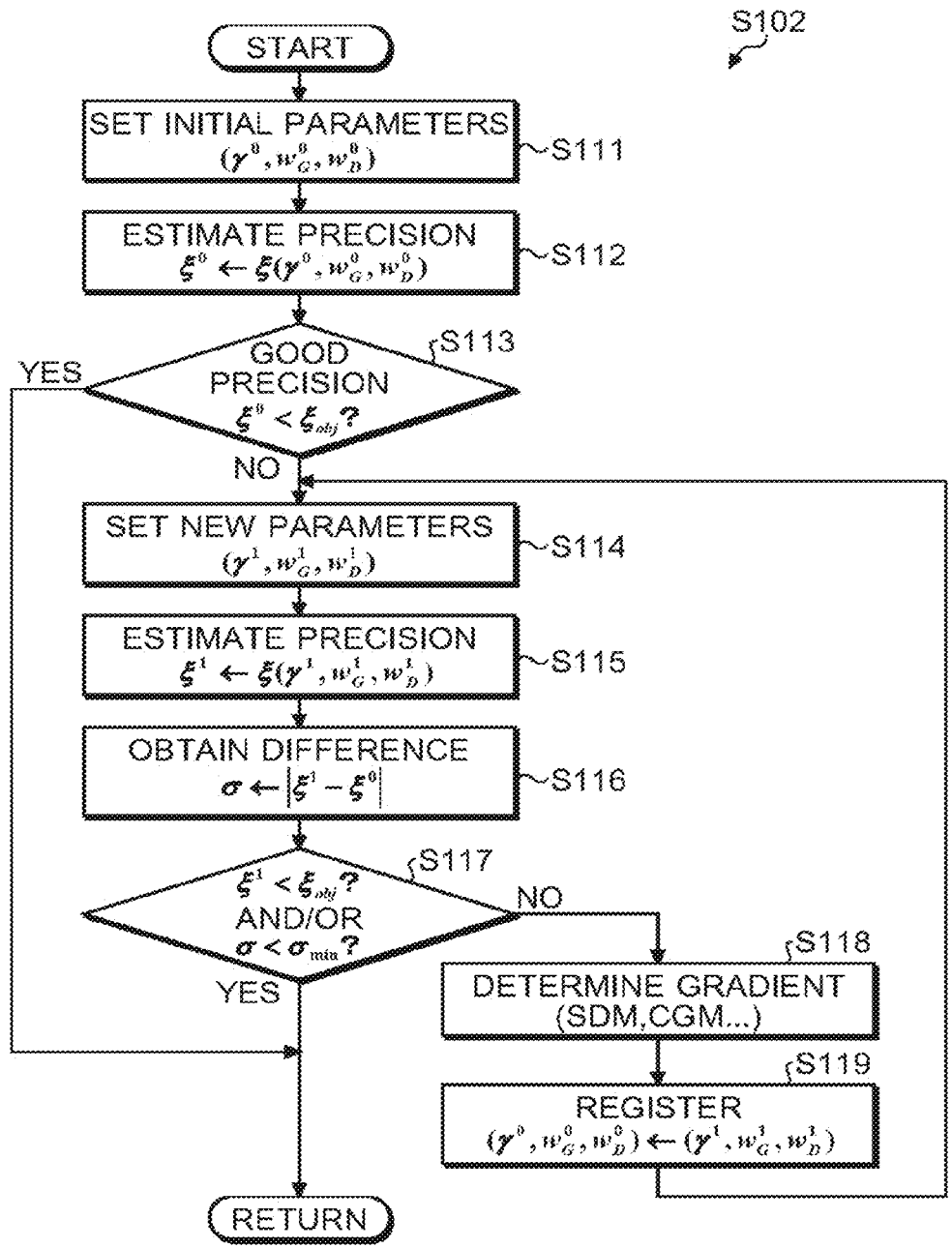
FIG. 6B is a flowchart for explaining step S102 in FIG. 6A in more detail.

Step S102 in FIG. 6A is explained in more detail in a flowchart illustrated in FIG. 6B. The step S102 is an irradiation parameter improvement that results in an enhancement (or optimization) of the thermal laser stimulation method according to the embodiment. As shown in FIG. 6B, in step S111, the computer system 101 introduces an initial set of irradiation parameters. These initial set of irradiation parameters can be set arbitrarily within the technical boundaries of the laser source 2 and the optical system 3.

In step S112, the computer system 101 obtains a precision estimate $\xi^0$ for the initial set of irradiation parameters. In step S113, the computer system 101 determines whether the precision estimate $\xi^0$ for the initial set of irradiation parameters is good enough, i.e., whether the precision estimate $\xi^0$ is less than an objective precision $\xi_{obj}$. The objective precision $\xi_{obj}$ usually depends on the resolution of a final destructive method that is used to analyze the fault after a noninvasive detection method, such as the disclosed thermal stimulation apparatus. When the precision estimate $\xi^0$ is within the objective precision $\xi_{obj}$ (step S113; YES), then the computer system 101 finishes this operation because the initial estimate $\xi^0$ is good enough for detecting the fault in the test object.

When the precision estimate $\xi^0$ is not within the objective precision $\xi_{obj}$ (step S113; NO), then the computer system 101 progresses to step S114 for testing a new set of irradiation parameters. In step S114, the computer system 101 introduces a new set of irradiation parameters. If step S114 is executed for the first time, then this new set of parameters is chosen arbitrarily within the technical boundaries of the laser source 2 and the optical system 3, but different from the initial set of irradiation parameters. If step S114 is not executed for the first time, then the new set of parameters ($\gamma^1$, $w_G^1$, $w_D^1$) will be determined based on a method executed in step S118. After executing step S114, the computer system 101 obtains a new precision estimate $\xi^1$ by executing the step S115.

In step S116, the computer system 101 obtains a difference a between the initial precision estimate $0°$ and the new precision estimate $\xi^1$. In step S117, the computer system 101 checks one or two conditions; first, whether $\xi^1$ is less than $\xi^0$; second, whether the difference $\sigma$ is smaller than a given value $\sigma_{min}$. When one or both of these conditions is met (step S117; YES), then the computer system 101 finishes this operation because the precision estimate (is good enough or it cannot be further improved.

Moreover, note that the first time the step S116 is executed, $\xi^0$ corresponds to the initial precision estimate output from step S112, whereas the second time the step S116 is executed $\xi^0$ corresponds to the previous value of $\xi^1$ as determined in step S119.

Furthermore, no details are given on step S118 where various gradients (and/or Jacobians) are determined because any available method can be readily used, e.g., Conjugate Gradient Method (CGM) or Steepest Descent Method (SDM) or Genetic Algorithms (GA).

Steps S112 and S115 in FIG. 6B are explained in more detail in a flowchart illustrated in FIG. 6C. The steps S112 and S115 are precision estimate processes of a thermal laser stimulation method according to the embodiment. As shown in FIG. 6C, in step S121, the computer system 101 determines a permissible laser power $P_{perm}$. In step S122, the computer system 101 determines the temperature field T for the permissible laser power. In step S123, the computer system 101 determines a maximum temperature $T_{max}$ at the target depth X, and then the computer system 101 estimates a signal (which is detectable with the signal detector 105) from the maximum temperature $T_{max}$ and noises $\eta$. In step S124, the computer system 101 obtains a precision estimate for the corresponding irradiation parameters and its permissible laser power $P_{perm}$.

Figure 6D:
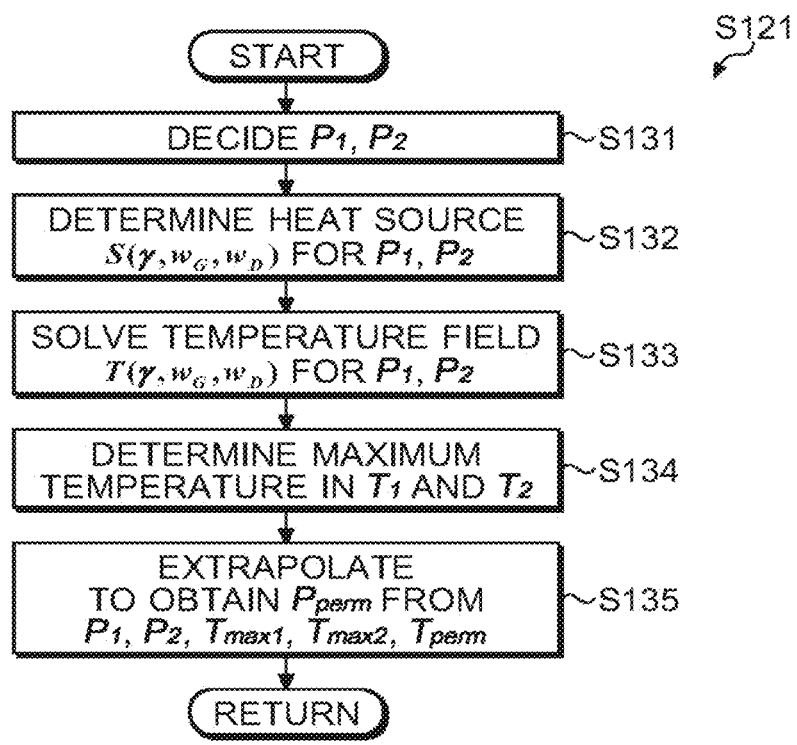
FIG. 6D is a flowchart for explaining step S121 in FIG. 6C in more detail.

Step S121 in FIG. 6C is explained in more detail in a flowchart illustrated in FIG. 6D. The step S121 is a permissible temperature estimate process for a thermal laser stimulation method according to the embodiment. As shown in FIG. 6D, in step S131, the computer system 101 decides two laser power values $P_1$ and $P_2$ within the technical constraints of the laser source 2.

In step S132, the computer system 101 determines the heat source $S_1(\gamma, w_G, w_D)$ and $S_2(\gamma, w_G, w_D)$ for the laser powers $P_1$ and $P_2$, respectively. The heat source S has the form described in Equation (1) according to the embodiment. However, a heat source S can have a plurality of shapes as those shown in FIGS. 3A to 3C, and the heat source S can be estimated with a plurality of methods or a combination of such. For example, a computational electromagnetics method that solves light phenomena, e.g., scattering and diffraction in periodic dielectric structures, could be used to estimate a heat source S that directly results from light absorption in the test object.

In step S133, the computer system 101 determines temperature fields $T_1$ and $T_2$ for the laser powers $P_1$ and $P_2$, respectively. The temperature fields $T_1$ and $T_2$ can be determined by a diversity of methods. According to the embodiment, T is determined by a numerical calculation that is based on a heat diffusion equation where the temperature T is governed by the following Equation (3).

$$\frac{\partial}{\partial x}\left(\lambda_x \frac{\partial T}{\partial x}\right) + \frac{\partial}{\partial y}\left(\lambda_y \frac{\partial T}{\partial y}\right) + \frac{\partial}{\partial z}\left(\lambda_z \frac{\partial T}{\partial z}\right) + S = \rho c_p \frac{\partial T}{\partial t} \quad (3)$$

In Equation (3), $\lambda_x$, $\lambda_y$, and $\lambda_z$ are the thermal conductivities in a system of Cartesian coordinates, $\rho$ is density, $c_p$ is the specific heat capacity, and t is time. Equation (3) is corresponded to the governing equation of T in an infinitesimal control volume dx×dy×dz.

The thermophysical properties $\lambda_x$, $\lambda_y$, $\lambda_z$ (different to $\lambda_0$ that is the wavelength), $\rho$ and $c_p$ are local properties within the infinitesimal volume. For a composite VLSI test object, bulk thermophysical properties could be determined, e.g., using thermal resistance circuits, in order to ease a numerical calculation. The same principle applies to the attenuation coefficient $\alpha$ in Equation (2).

Even though Equation (3) is used in the embodiment, a plurality of methods could be used to determine the temperature field. For example, a statistical analysis based on a Monte Carlo Method and/or Boltzmann transport equations could be sought for predicting phonon dispersion and estimating a temperature field T inside the test object.

Figure 6E:
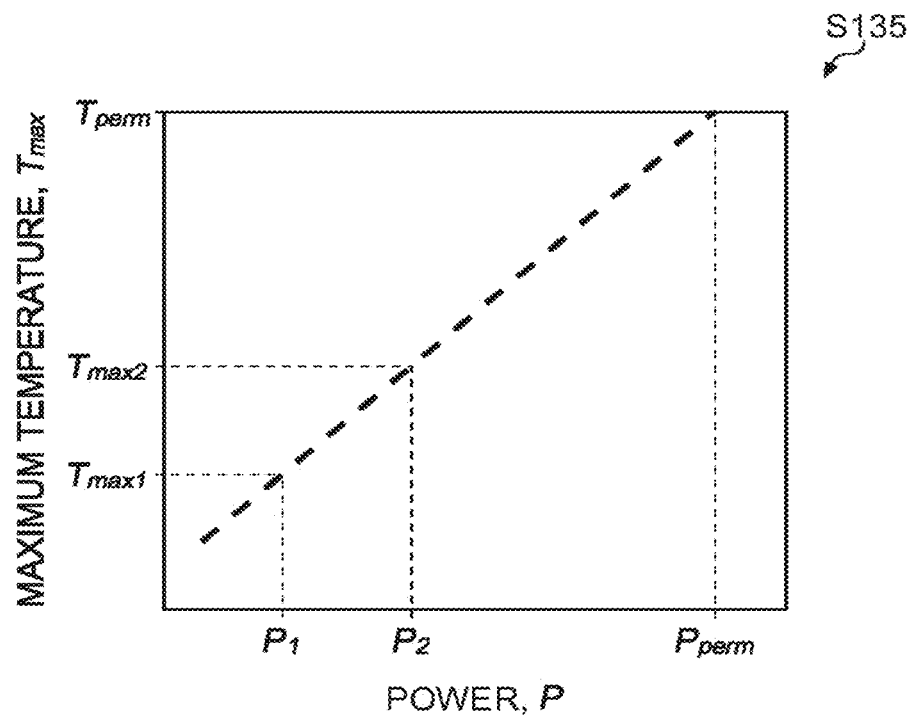
FIG. 6E is a graph for explaining the interpolation process in step S135 in FIG. 6D.

In step S134, the computer system 101 determines maximum temperatures $T_{max1}$ and $T_{max2}$ for the temperatures fields $T_1$ and $T_2$, respectively. In step S135, as shown in FIG. 6E, using the laser powers $P_1$ and $P_2$ and the maximum temperatures $T_{max1}$ and $T_{max2}$, the computer system 101 determines by extrapolation (or interpolation) the permissible laser power $P_{perm}$, i.e., the maximum power where there is no damage in the test object 1.

Figure 7A:
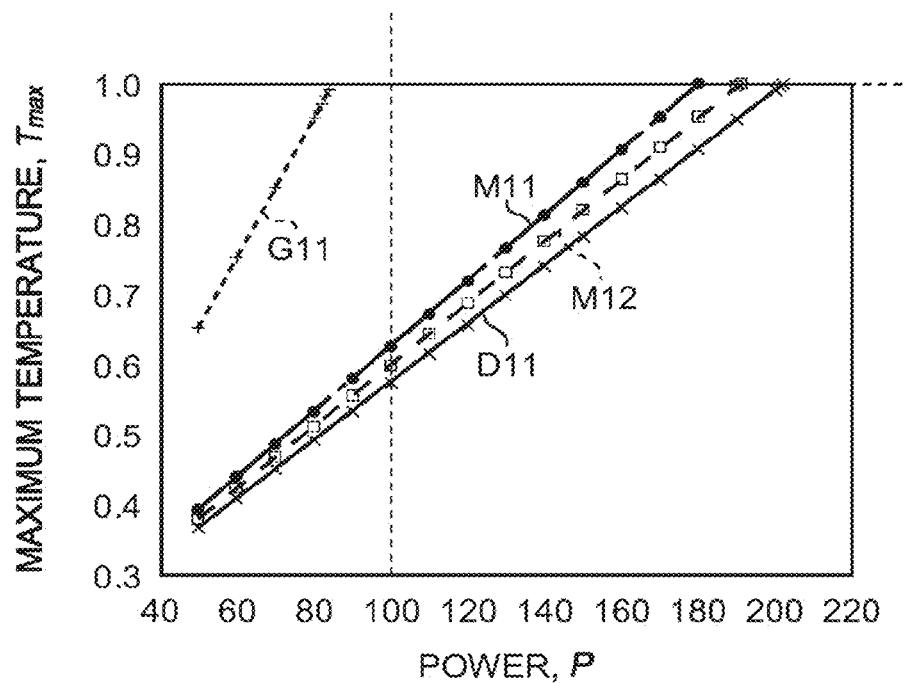
FIG. 7A is a graph for explaining the extrapolation process in step S135 for determining a permissible power in four sets of irradiation parameters.
Figure 7B:
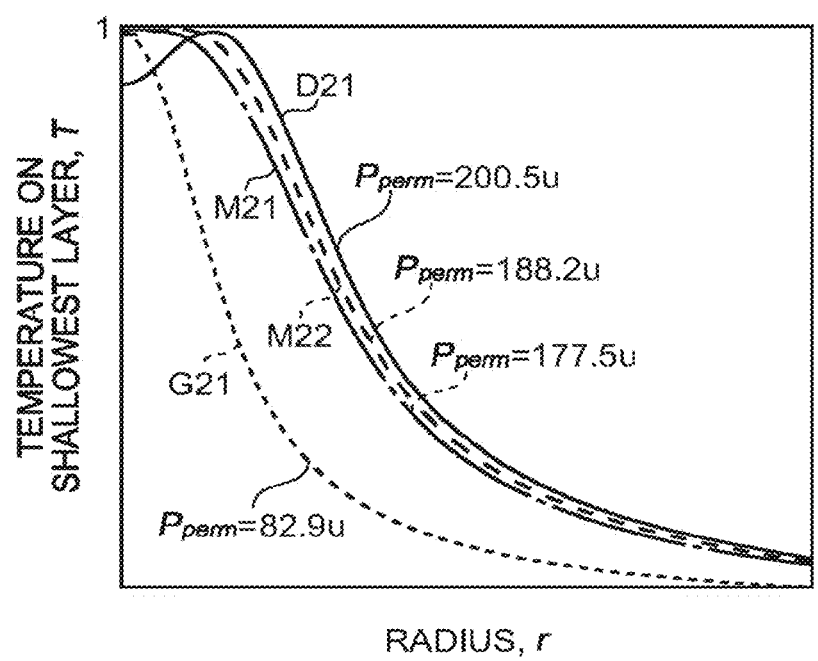
FIG. 7B is a graph illustrating the numerical results of the temperature on a shallowest layer when irradiating with the permissible power found in step S135 for the four sets of the irradiation parameters.

FIGS. 7A and 7B show the extrapolation process in step S135 and the numerical results with a permissible power for four sets of irradiation parameters. In FIG. 7A, relationships between the irradiation power P ($P=P_G+P_D$) and maximum temperature $T_{max}$ are presented for the Gaussian laser beam (the first variation), the doughnut laser beam (the fourth variation), and the two modified laser beams of the CASEs A and B (the second and third variations). A line G11 shows a relationship for the Gaussian laser beam, a line D11 shows a relationship for the doughnut laser beam, and lines M11 and M12 show relationships for the two modified laser beams of the CASEs A and B, respectively.

The CASEs A and B consist of a doughnut components of 85% and 90%, respectively, of the total irradiation power P (see table in FIG. 5A). Moreover, note that the maximum temperature in FIG. 7A is normalized with the permissible temperature $T_{perm}$, so that $T_{max}<1$ means that the maximum temperature inside the test object 1 is less than the permissible temperature. Note that the relationship between irradiation power P and maximum temperature $T_{max}$ is linear. Therefore, an extrapolation (or interpolation) can be made to estimate the permissible laser power $P_p e±r$ as shown in FIG. 7A.

FIG. 7B shows the numerical results of the temperature on the shallowest layer for the extrapolated permissible power for four sets of irradiation parameters. In FIG. 7B, a line G21 shows a result of the extrapolated permissible power $P_{perm}=82.9$ [u] for the Gaussian laser beam, a line D21 shows a result of the extrapolated permissible power $P_{perm}=200.5$ [u] for the doughnut laser beam, and lines M21 and M22 show results of the extrapolated permissible powers $P_{perm}=177.5$ [u] and $P_{perm}=188.2$ [u] for the two modified laser beams of the CASEs A and B, respectively. As shown in FIG. 7B, the numerical results indicate that the use of $P_{perm}$ fits the maximum temperature to the permissible temperature (i.e., T=1.0) while the value of $P_{perm}$ increases as the contribution of the doughnut component is increased.

Figure 8:
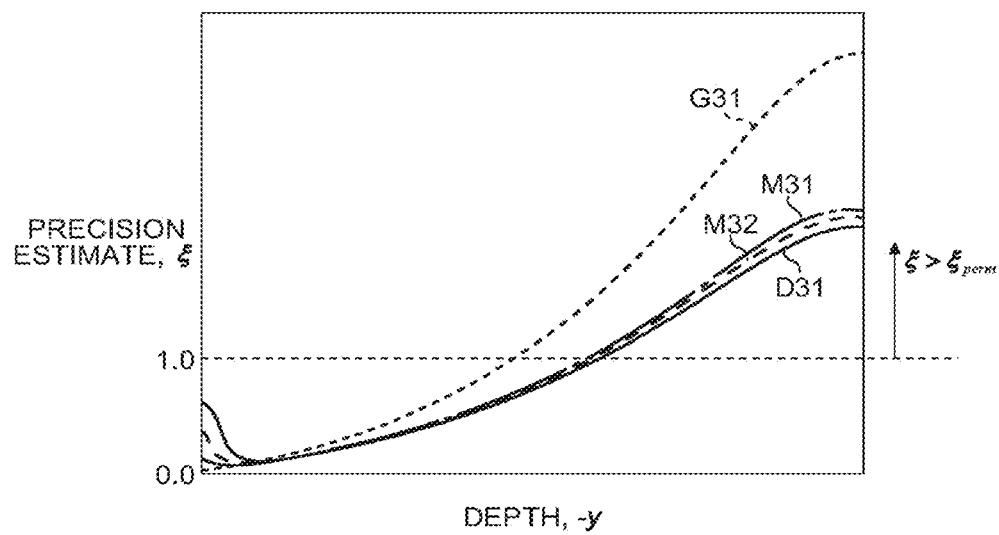
FIG. 8 is a diagram illustrating a precision estimate from numerical simulation for four different kinds of irradiation listed in FIG. 5A according the embodiment.

A high permissible temperature $P_{perm}$ would increase the thermal stimulation in the test object 1. FIG. 8 shows that, in fact, a better measurement precision (is achieved in deep layers when the test object 1 is irradiated with the modified laser beam C3 with the peripheral component C2.

In FIG. 8, the abscissa axis is the depth while the ordinate axis is a dimensionless precision estimate $\xi$, where $\xi$ is normalized with a permissible precision $\xi_{perm}$. A line G31 shows a relationship between a measurement precision $\xi$ and a depth for the Gaussian laser beam, a line D31 shows a relationship between a measurement precision $\xi$ and a depth for the doughnut laser beam, and lines M31 and M32 show relationships between measurement precisions $\xi$ and depths for the two modified laser beams of the CASEs A and B, respectively.

A precision improvement due to a doughnut-shape laser beam is expected since more energy is inputted onto the test object 1 than with the Gaussian laser beam because the doughnut-shape laser beam has a higher permissible laser power. However, FIG. 8 also shows that in shallow layers the doughnut-shape laser beam could worsen the measurement precision. Such deterioration is expected since the doughnut-shape laser beam has a region that is more broadly thermally stimulated in shallow layers than its Gaussian counterpart, as suggested by the intensity profile shown in FIG. 4. In order to overcome these difficulties, a combination of a Gaussian laser beam (the central component C1) and a doughnut-shape laser beam (the peripheral component C2), based on the above-described Equation (1), is presented according to the embodiment.

Figure 9A:
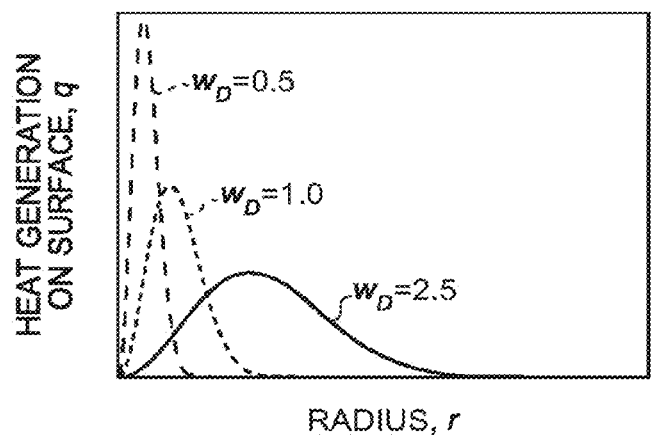
FIG. 9A is a diagram illustrating examples of three doughnut radii according to embodiment.
Figure 9B:
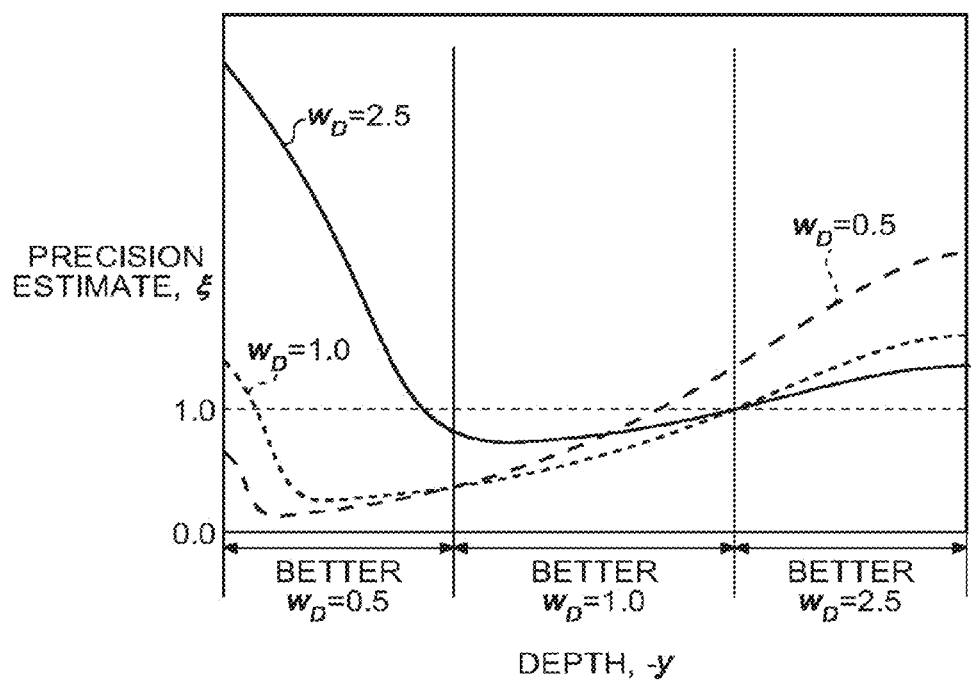
FIG. 9B is a diagram illustrating a precision estimate for a doughnut irradiation for three doughnut radii shown in FIG. 9A according to embodiment.

Firstly, a doughnut-shaped laser beam with an increased characteristic radius $w_D$ enhances the measurement precision for faults in deep layers of the test object 1, as shown in FIGS. 9A and 9B. For example, a doughnut characteristic radius of $w_D=2.5$ would be better than a doughnut characteristic radius of $w_D=0.5$ and $w_D=1.0$ for increasing the precision in deep layers.

Figure 9C:
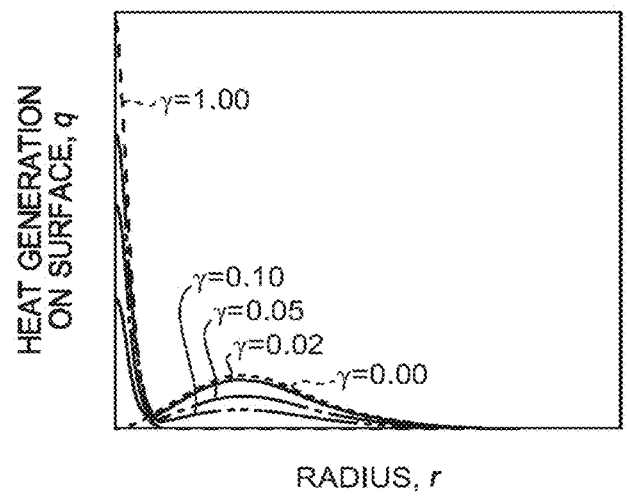
FIG. 9C is a diagram illustrating examples of three doughnut-shaped beams with a different Gaussian-doughnut combination ratio and fixed Gaussian and doughnut radii according to the embodiment.
Figure 9D:
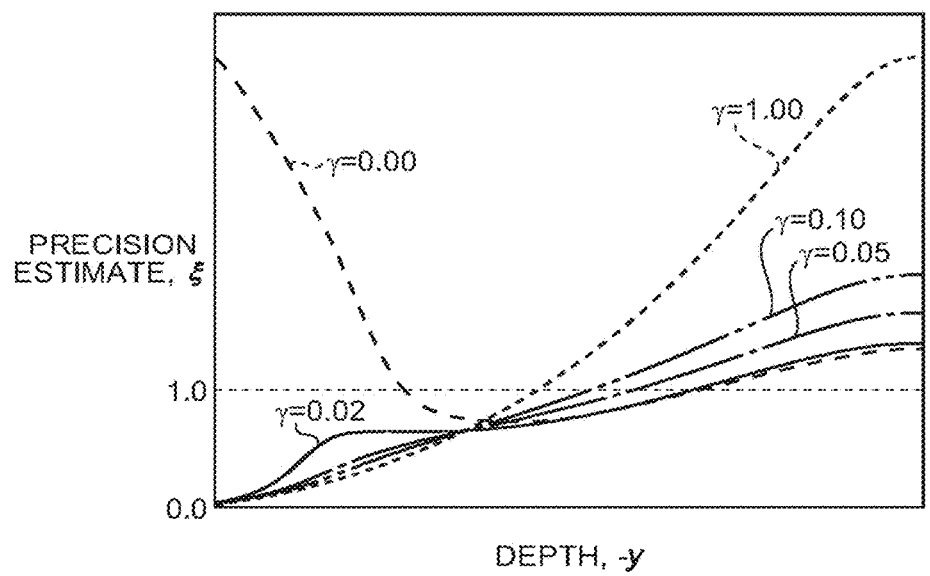
FIG. 9D is a diagram illustrating a precision estimate for the five beams shown in FIG. 9C according to the embodiment.

Secondly, if a combination ratio $\gamma$ is set for the Gaussian component ($\gamma=1$ is fully Gaussian and $\gamma=0$ is fully doughnut-shaped), then the precision in shallow layers can be improved, as shown in FIGS. 9C and 9D. Hence, a suitable irradiation, such as the irradiation intensity corresponding to $\gamma=0.02$ in FIG. 9D, would significantly improve the precision measurement in deep layers while maintaining a good precision, i.e., bellow a permissible value of $\xi_{perm}$, even for shallow layers. Hereinafter, a plurality of optical apparatus and methods are presented for generating a tunable combination of Gaussian and doughnut-shaped irradiation according to the embodiment.

Figure 10A:
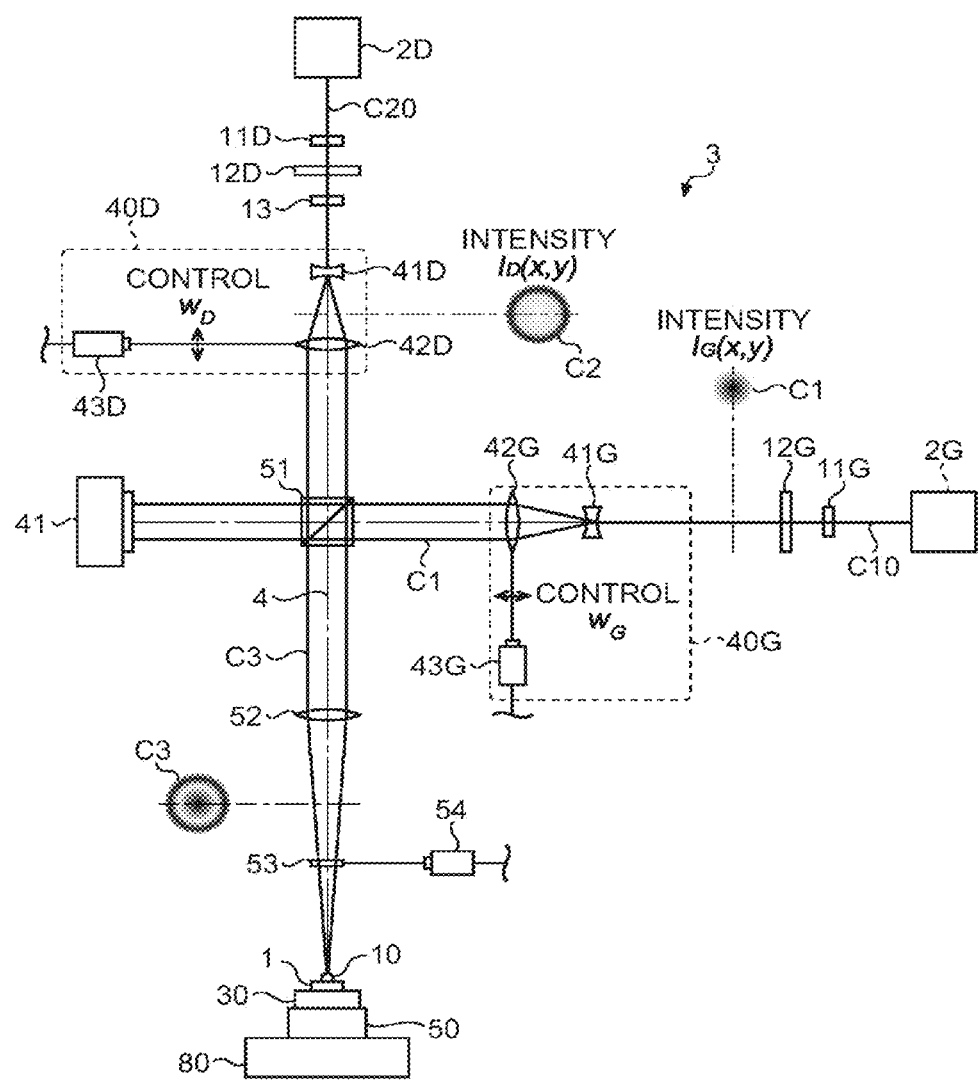
FIG. 10A is a schematic diagram showing an example of an optical system according to the embodiment.

FIG. 10A shows an arrangement of the optical system 3 in the thermal laser stimulation apparatus 100 according to the embodiment. The optical system 3 is used to manipulate laser beams outputted from the laser sources 2 including laser sources 2G and 2D. The optical system 3 comprises ND filters 11G and 11D, polarizing plates 12G and 12D, a wavefront converter 13, beam expanders 40G and 40D, a beam splitter 51, a camera 41, a beam collector 52, an optical element 53, a scanner 54, a lens 10, a circuit board 30, a stage 50, and a stand 80.

The computer system 101 shown in FIG. 2 is used to control several elements in the optical system 3 and to record the electric signal changes measured from the test object 1 using the signal detector 105.

In the optical system 3, laser sources 2G and 2D output laser beams C10 and C20, respectively, with an independent Gaussian intensity profile. The intensity of the laser beams C10 and C20 can be adjusted with ND filters 11G and 11D, respectively. Laser beams C10 and C20 can also respectively pass through polarizing plate 12G and 12D in order to guarantee a desired linear polarization state, e.g., 45 degree angle respect to a horizontal reference line; if the linear polarization state of laser beams C10 and C20 is known just after exiting the laser source 2G and 2D, respectively, then polarizing plates 12G and/or 12D could be omitted.

The laser beam C10 having been passed through the ND filter 11G and the polarization plate 12G enters the beam expander 40G. The beam expander 40G comprises a concave lens 41G, a convex lens 42G and an actuator 43G. The laser beam C10 is expanded by the concave lens 40G, and then, the expanded laser beam C10 is collimated by the convex lens 42G. The actuator 43G adjusts the position of convex lens 42G, whose focus can also be changed in order to control the radius $w_G$ of the Gaussian intensity profile of laser beam C10. After which, the laser beam C10 enters the beam splitter 51.

On the other hand, the laser source 2D outputs a laser beam C20 whose intensity is modified to a doughnut-shape intensity profile by the wavefront converter 13.

The laser beam C20 having been passed through the ND filter 11D and the polarizing plate 12D enters the beam expander 40D. The beam expander 40D comprises a concave lens 41D, a convex lens 42D and an actuator 43D. The laser beam C20 is expanded by the concave lens 41D, and then, the expanded laser beam C20 is collimated by the convex lens 42D. The actuator 43D adjusts the position of convex lens 42D, whose focus can also be changed in order to control the radius $w_D$ of the doughnut-shaped intensity profile of laser beam C20. After which, the laser beam C20 enters the beam splitter 51.

The beam splitter 51 may be a polarizer or any kind of mirror and/or prism. The beam splitter 51 generates the modified laser beam C3 by multiplexing the laser beams C10 and C20, and emits the modified laser beam C3 toward the test object 1. Furthermore, the beam splitter 51 may also emit the intensity profile of beams C10 and C20 to the camera 41 in order manage the adjustment of the laser beam intensities, e.g., $I_D$ and $I_G$ that comprise $P_G$ and $P_D$ and radii $w_G$ and $w_D$ in Equation (1). Likewise, the beam splitter 51 can also be removed in order to adjust the laser beam C10, or the beam splitter 51 can be changed with a fixed mirror in order to adjust the laser beam C20.

The modified laser beam C3 emitted from the beam splitter 51 is focused on the test object 1 by passing through the beam collector 52. The beam collector 52 can be any one of, or a combination of, one or more concave lenses and/or one or more convex lenses and/or one or more objective lenses.

The modified laser beam C3 then passes through the optical element 53 that is used to scan an irradiated zone on the test object 1. The optical element 53 can be a flat plate, a mirror, a lens, or any other element that can be used for scanning the laser beam C3. The optical element 53 is manipulated with the scanner 54 that can comprise a Piezo element and/or a servo motor and/or a stepper motor and/or a linear motor.

The modified laser beam C3 is then focused on the test object 1 via the lens 10. The lens 10 can be a solid immersed lens (SIL) or any derivative in order to modify the numerical aperture of the optical system 3. The diameter of the laser beam C3 can then be modified according to the following Equation (4).

$$\phi = 1.22 \lambda / NA \quad (4)$$

In Equation (4), $\phi$ is the diameter of the irradiated zone created by the incidence of the modified laser beam C3 on the shallow layers of the test object 1, $\lambda$ is a wavelength of the modified laser beam C3, and NA is the numerical aperture of the optical system 3. Equation (4) is formulated according to an ideal Airy disk intensity distribution on the shallow layers. The wavelength of the modified laser beam C3 is usually in the infrared region to reduce the absorption in a substrate 25 of the test object 1 (see FIG. 10C). Moreover, a NA and A in the optical system 3 should be selected according to a value that maximizes the accuracy of the measurement, e.g., following the process described in FIG. 6A.

Furthermore, as shown in FIG. 10A, the test object 1 is mounted on the circuit board 30 wherein different pins of peripherals of the test object 1 are wired to the circuit board 30. The circuit board 30 is used to apply a constant or variable voltage difference along one path in the test object 1 or multiple paths in the test object 1, wherein these paths may include individual layers of the test object 1 in order to detect a depth of each failure. The circuit board 30 is fixed on the stage 50. The stage 50 is used to control a spatial location of the test object 1 in the optical system 3; the spatial location can be controlled in any of three Cartesian coordinates. Moreover, the stage 50 is mounted on the stand 80, which can comprise damping features in order to isolate the optical system 3 from external vibrations that can potentially affect measurement accuracy.

Figure 10B:
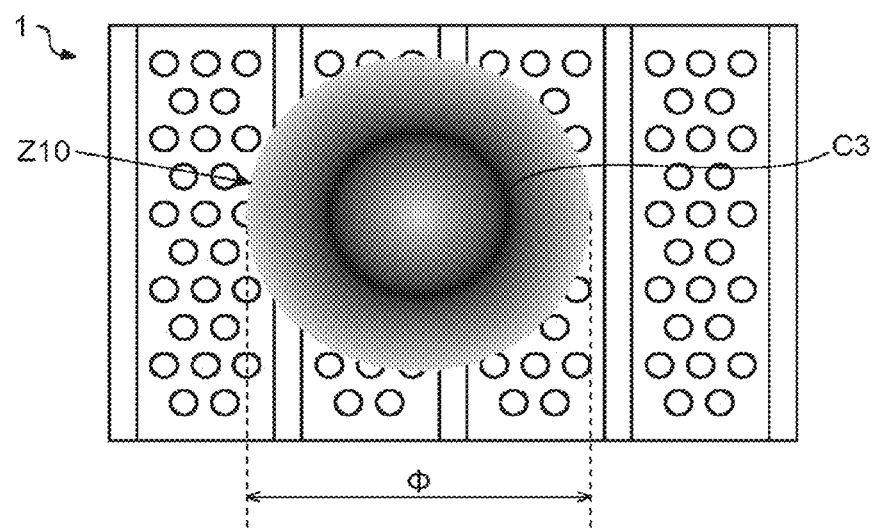
FIG. 10B is upper and side views of a schematic diagram of the test object and an irradiated zone that is generated due to an incidence of the modified laser beam onto the test object according to the embodiment.

FIG. 10B shows upper and side views of a schematic diagram of a typical multilayer flash memory chip as the test object 1 and an irradiated zone Z10 that is generated due to the incidence of the modified laser beam C3 onto a multilayer zone 26 of the test object 1. In the embodiment, a typical multilayer flash memory structure is used as a general example of the test object 1; however, any planar or multilayer semiconductor device can be analyzed with the presented embodiments. The object does not need to have a periodic structure neither a pre-established structural characteristic.

Figure 10C:
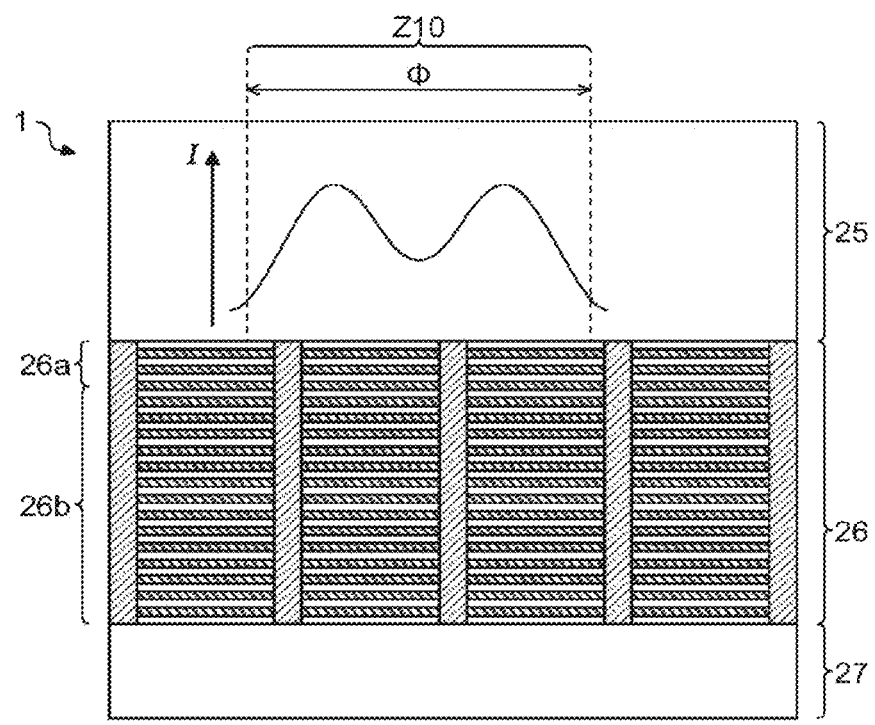
FIG. 10C is a lateral view schematic diagram of the test object according to the embodiment.

FIG. 10C shows a lateral view schematic diagram of the test object 1. An intensity of the irradiated zone Z10 on a shallow layers 26a of the test object 1 is also shown in FIG. 10C, which corresponds to the lateral view of the test object 1 shown in FIG. 10B.

The embodiment is primarily directed to detect faults in the deep layers 26b, but it can also detect faults in the shallow layers 26a. Since infrared irradiation is highly absorbed by different materials in the circuit layers 27, then the laser beam C3 is preferably directed through the substrate layer 25, which is usually made of one material semi-transparent against the wavelength $\lambda$ of the modified laser beam C3.

FIG. 11 shows another arrangement of the optical system 3 in the thermal laser stimulation apparatus 100 according to the embodiment. In FIG. 11, to the same structures as those shown in FIG. 10A, the same reference numbers will be applied, and the redundant explanations thereof will be omitted.

As shown in FIG. 11, the optical system 300 is used to manipulate a laser beam outputted from the laser source 2. The optical system 300 comprises an ND filter 11, a polarizing plate 12, a beam expander 40, a beam splitter 55, an adjustable mirror 60G, an actuator 61, a wavefront converter 13, a fixed mirror 60D, the beam splitter 51, the camera 41, the beam collector 52, a fixed mirror 62, an adjustable mirror 63, a scanner 64, the lens 10, the circuit board 30, the stage 50, and the stand 80.

In the optical system 300, the laser source 2 outputs a laser beam C30 with a Gaussian intensity profile. The laser beam C30 could pass through the ND filter 11 and polarizing plate 12 in order to control the intensity and linear polarization of the laser beam C30, respectively; if the intensity or linear polarization state of the laser beam C30 is known just after exiting the laser source 2, then optical elements 11 and 12 could be omitted. A direction of the desired linear polarization state is slanted by θ (θ is 45°, for instance) with respect to the horizontal direction.

The laser beam C30 having been passed through the polarizing plate 11 enters the beam expander 40. The beam expander 40 comprises a concave lens 41 and a convex lens 42, and expands a diameter of the laser beam C30.

The expanded laser beam C30 is split into two laser beams. One laser beam is the Gaussian laser beam C1, and it is introduced to the beam splitter 51 through a reflection by the adjustable mirror 60G. The other laser beam is converted into the doughnut-shape laser beam (corresponding to the peripheral component C2) by passing through the wavefront converter 13. The wavefront converter 13 may comprise axicon mirrors/lenses, and converts a Gaussian laser beam into a doughnut-shape laser beam. The doughnut-shape laser beam (C2) outputted from the wavefront converter 13 enters the beam splitter 51 through reflection by the fixed mirror 60D.

The beam splitter 51 generates the modified laser beam C3 by multiplexing the laser beams (C1 and C2), and emits the modified laser beam C3 toward the test object 1.

The modified laser beam C3 emitted from the beam splitter 51 is focused on the test object 1 by passing through the beam collector 52.

After which, the modified laser beam C3 is reflected by the fixed mirror 62, and then passes through the adjustable mirror 63 that is used to scan an irradiated zone on the test object 1. The adjustable mirror 63 is manipulated with the scanner 64 that can comprise a Piezo element and/or a servo motor and/or a stepper motor and/or a linear motor. Then, the modified laser beam C3 is focused on the test object 1 via the lens 10.

While certain embodiments have been described, these embodiments have been presented by way of example only, and are not intended to limit the scope of the inventions. Indeed, the novel embodiments described herein may be embodied in a variety of other forms, furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A thermal laser stimulation apparatus comprising:
a laser source that outputs a laser beam;
an optical system that modifies the laser beam, and directs the modified laser beam onto a test object;
a signal detector that detects a change of signal in the process of irradiating the test object with the modified laser beam; and
a computer system that performs a failure analysis based on the change detected by the signal detector, wherein
the optical system modifies the laser beam so that the modified laser beam generates an irradiation zone that includes a first intensity component of which peak intensity is near an irradiation axis and a second intensity component of which peak intensity is around the irradiation axis,
the laser source includes a first laser source that outputs a first laser beam and a second laser source that outputs a second laser beam, and
the optical system converts the first laser beam into the first intensity component, converts the second laser beam into the second intensity component, and generates the modified laser beam by multiplexing the first intensity component and the second intensity component.

2. The apparatus according to claim 1, wherein
the first intensity component has a Gaussian intensity profile, and
the second intensity component has a doughnut-shape intensity profile of which centroid coincides with the irradiation axis.

3. The apparatus according to claim 1, wherein
the first intensity component has a Gaussian intensity profile, and
the second intensity component include a plurality of third intensity components each of which has a doughnut-shape intensity profile and each of which centroid coincides with the irradiation axis.

4. The apparatus according to claim 1, wherein
the first intensity component has a Gaussian intensity profile, and
the second intensity component include a plurality of third intensity components each of which has a Gaussian intensity profile and whose centroid coincides with the irradiation axis.

5. The apparatus according to claim 1, wherein the computer system optimizes at least one of an intensity of the laser beam, a ratio of the first and second intensity components, a distribution radius of the first intensity component, and distribution radius of the second intensity component based on an estimation of the change detected by the signal detector.

6. The apparatus according to claim 1, wherein the optical system controls a size of the modified laser beam.

7. The apparatus according to claim 1, wherein the optical system modifies an intensity of the modified laser beam.

8. The apparatus according to claim 1, further comprising an environment control system that controls an ambient temperature, humidity and pressure around the test object.

9. The apparatus according to claim 1, wherein the signal detector detects the change of the signal which is changed depending on a thermophysical property of the test object.

10. The apparatus according to claim 1, wherein the signal detector detects a difference between magnitudes of the signal when the test object is irradiated at a given location with the modified laser beam and the magnitude of the signal before and/or after the same location is irradiated with the modified laser beam as the change.

11. The apparatus according to claim 1, wherein the computer system determines a depth of a fault in the test object based on the change detected by the signal detector.

12. The apparatus according to claim 1, wherein the computer system determines a location of a fault in the test object based on the change detected by the signal detector.

13. A thermal laser stimulation apparatus comprising:
a laser source that outputs a laser beam,
an optical system that modifies the laser beam, and directs the modified laser beam onto a test object;
a signal detector that detects a change of signal in the process of irradiating the test object with the modified laser beam, and
a computer system that performs a failure analysis based on the change detected by the signal detector, wherein
the optical system modifies the laser beam so that the modified laser beam generates an irradiation zone that includes a first intensity component of which peak intensity is near an irradiation axis and a second intensity component of which peak intensity is around the irradiation axis, and
the signal detector detects a difference between a magnitude of a signal detected from the test object when the test object is thermally stimulated in a region, which is in or around a zone being irradiated with the modified laser beam, and a magnitude of a signal detected from another thermally stimulated region in the test object as the change.

14. The apparatus according to claim 1, further comprising a signal generator that generates a first signal to be inputted into the test object, wherein
the test object generates a second signal in response to input of the first signal, and
the signal detector detects the change by detected the second signal.

15. The apparatus according to claim 14, wherein the first signal is a voltage signal or a current signal.

16. A method of thermally laser stimulating, comprising:
irradiating a test object with a laser beam;
detecting a change of signal in the process of irradiating the test object with the laser beam; and
performing a failure analysis based on the detected change of signal, wherein
the laser beam includes a first intensity component of which peak intensity is near an irradiation axis and a second intensity component of which peak intensity is around the irradiation axis, and
the irradiating includes:
outputting a first laser beam and a second laser beam,
converting the first laser beam into the first intensity component,
converting the second laser beam into the second intensity component, and
multiplexing the first intensity component and the second intensity component.

17. A non-transitory computer readable medium having a program for thermally stimulating, the program including instructions of:
outputting a laser beam;
detecting a change of signal in the process of irradiating a test object with the laser beam; and
performing a failure analysis based on the detected change of signal, wherein
the laser beam includes a first intensity component of which peak intensity is near an irradiation axis and a second intensity component of which peak intensity is around the irradiation axis, and
the outputting includes:
outputting a first laser beam and a second laser beam,
converting the first laser beam into the first intensity component,
converting the second laser beam into the second intensity component, and
multiplexing the first intensity component and the second intensity component.

* * * * *